(12) United States Patent
Wang et al.

(10) Patent No.: US 7,714,643 B1
(45) Date of Patent: May 11, 2010

(54) TUNING OF ANALOG FILTERS

(75) Inventors: Nanyan Wang, Burnaby (CA); Soon Sun Shin, Burnaby (CA)

(73) Assignee: PMC-Sierra, Inc., Santa Clara, CA (US)

( * ) Notice: Subject to any disclaimer, the term of this patent is extended or adjusted under 35 U.S.C. 154(b) by 159 days.

(21) Appl. No.: 12/044,636

(22) Filed: Mar. 7, 2008

(51) Int. Cl.
*H03K 5/00* (2006.01)

(52) U.S. Cl. ........................................ 327/553; 327/552

(58) Field of Classification Search .......... 327/551–559
See application file for complete search history.

(56) References Cited

U.S. PATENT DOCUMENTS

| | | | |
|---|---|---|---|
| 5,281,931 A * | 1/1994 | Bailey et al. | 333/17.1 |
| 5,731,737 A * | 3/1998 | Cranford et al. | 327/553 |
| 6,307,443 B1 * | 10/2001 | Gabara | 333/17.1 |
| 7,002,404 B2 | 2/2006 | Gaggl et al. | |
| 7,057,451 B2 | 6/2006 | Lou et al. | |
| 7,078,960 B2 | 7/2006 | Ezell | |
| 7,103,334 B1 | 9/2006 | Kumar | |

OTHER PUBLICATIONS

Sumesaglam, et al; A Digital Automatic Tuning Technique for High-Order Continuous-Time Filters; IEEE Transactions on Circuits and Systems—I: Regular Papers; Oct. 2004; pp. 1975-1984; vol. 51, No. 10.

Tong, et al; A Mixed-Signal Approach for Tuning Continuous-Time Low-Pass Filters; IEEE Transactions on Circuits and Systems—II: Express Briefs; Jun. 2004; pp. 307-314; vol. 51, No. 6.

Zargari, et al; A Single-Chip Dual-Band Tri-Mode CMOS Transceiver for IEEE 802.11a/b/g Wireless LAN; IEEE Journal of Solid-State Circuits; Dec. 2004; pp. 2239-2249; vol. 39, No. 12.

Zargari, et al; A Single-Chip Dual-Band Tri-Mode CMOS Transceiver for IEEE 802.11a/b/g Wireless LAN; 2004 IEEE International Solid-State Circuits Conference; Feb. 16, 2004; ISSCC 2004; Session 5; WLAN Transceivers; 5.4.

* cited by examiner

*Primary Examiner*—Dinh T. Le
(74) *Attorney, Agent, or Firm*—Knobbe Martens Olson & Bear LLP

(57) ABSTRACT

Apparatus and methods tune analog filters that are parts of systems. When an analog filter is inserted into a system, the analog filter can be difficult to tune because of the difficulty in observing the analog filter's characteristics without being interfered by other circuits in the system. In one embodiment, analog filters are bypassed, and a response is determined. To this response, a time-invariant digital filter is applied to generate a reference response, such as an ideal response. The analog filters are then enabled and adjusted so that the difference between the response of the system and the reference response is minimized. This technique can be applied to arbitrary-order analog filters and can be used even when other circuits affect the observed filter response.

23 Claims, 7 Drawing Sheets

TUNING OF ANALOG FILTERS

BACKGROUND

1. Field of the Invention

The invention generally relates to electronics. In particular, the invention relates to communication systems in which analog filters are tuned.

2. Description of the Related Art

Analog filters are widely used in radio transceivers. Typically, a communication device uses assigned channels with given bandwidth. In a transmitter, analog filters are employed to reduce signal leakage to adjacent channels and meet the requirements of a transmission spectral mask. In a receiver, analog filters are used to pass signals in the desired channel while suppressing interference from other channels. Requirements for analog filters in radio transceivers can be specified by filter parameters such as time-constant, cutoff frequency, passband flatness, stopband attenuation, group delay, etc. Since an analog filter can vary significantly with manufacturing process and temperature variation, an analog filter should be tunable to accommodate the variability. In addition, wireless communication systems have been moving towards a single device that can support multiple standards and operate in various environments. This also requires analog filters to be tunable and configurable to ease system complexity and reduce cost.

In phase-response based filter tuning methods, an analog filter is tuned such that the phase shift between the test signal and the filtered signal matches a desired phase shift. See, for example, U.S. Pat. No. 7,103,334 to Kumar and A Digital Automatic Tuning Technique for High-Order Continuous-Time Filters, by Taner et al, IEEE Transactions on Circuits and Systems I, vol. 51, no. 10, pp. 1975-1984, October 2004. A test signal at a pre-defined limited number of frequencies is used to generate a filtered signal. This way, a filter is tuned at only the specified frequencies regardless of its amplitude response and phase response at other frequencies. However, it may not be practical to isolate an analog filter from the rest of circuits in a system. Circuits other than the filter being tuned in the signal path can cause a phase shift of the filtered signal. This can lead to an inaccurate estimation of the actual phase shift due to the analog filter, and, therefore to a degradation in tuning performance.

In time-constant-based filter tuning methods, an analog filter's cutoff frequency is tuned by measuring and adjusting a time constant associated with the cutoff frequency. See, for example, U.S. Pat. No. 7,057,451 to Lou, et al., A Mixed-Signal Approach for Tuning Continuous-Time Low-Pass Filters, IEEE Transactions on Circuits and Systems II: Express Briefs, vol. 51, no. 6, pp. 307-314, June, 2004, Anthony et al, and U.S. Pat. No. 7,002,404, by Gaggl, et al.

Since the time constant is determined by the product of resistance and capacitance values in the filter circuits, the filter tuning result is sensitive to other circuits in the signal path used for measuring the time constant. Moreover, the time-constant based methods are typically only suitable for the tuning of single-stage RC filters. In general, a multi-stage analog filter has several low-order analog filters, which are separated by other circuits in a system. Thus, both the phase-response and time-constant based methods can only tune a multi-stage analog filter stage by stage, which leaves the combined overall performance uncertain.

In master-slave tuning methods, an analog filter is tuned at the cost of using an additional analog master filter that is identical in design to the operating analog filter. See, for example, *A Single-Chip Dual-Band Tri-Mode CMOS Transceiver for IEEE 802.11a/b/g Wireless LAN*, by Masoud et al, IEEE Journal of Solid-State Circuits, vol. 39, no. 12, pp. 2239-2249, December, 2004 and U.S. Pat. No. 7,078,960 by Ezell. Instead of tuning the operating slave filter, the master analog filter is tuned, and the tuning results are then applied to the slave filter. The advantage of master-slave methods is that the slave filter in use can be tuned without interrupting ongoing communications. However, these methods require a relatively large die area, and variations between the master and slave can impair the accuracy of the actual tuning.

SUMMARY

When an analog filter is inserted into a system, the analog filter can be difficult to tune because of the difficulty in observing the analog filter's characteristics without being interfered by other circuits in the system. In one embodiment, analog filters are bypassed, and a response is determined. To this response, a time-invariant digital filter is applied to generate a reference response, such as an ideal response. The analog filters are then enabled and adjusted so that the difference between the response of the system and the reference response is minimized. This technique can be applied to arbitrary-order filters and can be used even when other circuits affect the observed filter response.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Disclosed techniques enable tuning of arbitrary-order analog filters and multi-stage analog filters in terms of a desired filter transfer function. This leads to superior performance which translates into reduced system complexity and cost.

Although particular embodiments are described herein, other embodiments of the invention, including embodiments that do not provide all of the benefits and features set forth herein, will be apparent to those of ordinary skill in the art.

Typical air-interface standards of communication systems have stringent requirements on adjacent interference rejection (receiver) and transmission spectral mask (transmitter). In order to meet these requirements, an analog filter typically uses on-chip tuning to correct variability over, for example, temperature and manufacturing processes and to set the filter to a desired state.

Techniques for filter tuning based on a transfer function of an analog filter are disclosed. For example, such techniques can be used to (1) tune multiple filter parameters to meet more than one filter specification at the same time; and (2) compensate for filter observation errors due to circuits other than the analog filter itself, which enables tuning of multi-stage analog filters.

The tuning of multiple filter parameters can be difficult. In communication devices, an analog filter, particularly a relatively high-order (>2) analog filter, typically needs to meet multiple requirements such as passband flatness, stopband attenuation, cutoff frequency, group delay, etc. In general, the satisfaction of one requirement cannot guarantee the satisfaction of other requirements. Conventional filter tuning methods that tune an analog filter based on a single filter parameter have limited tuning range and solution space. As a result, it is difficult and costly to satisfy filter requirements over temperature and process variation.

Figure 1:
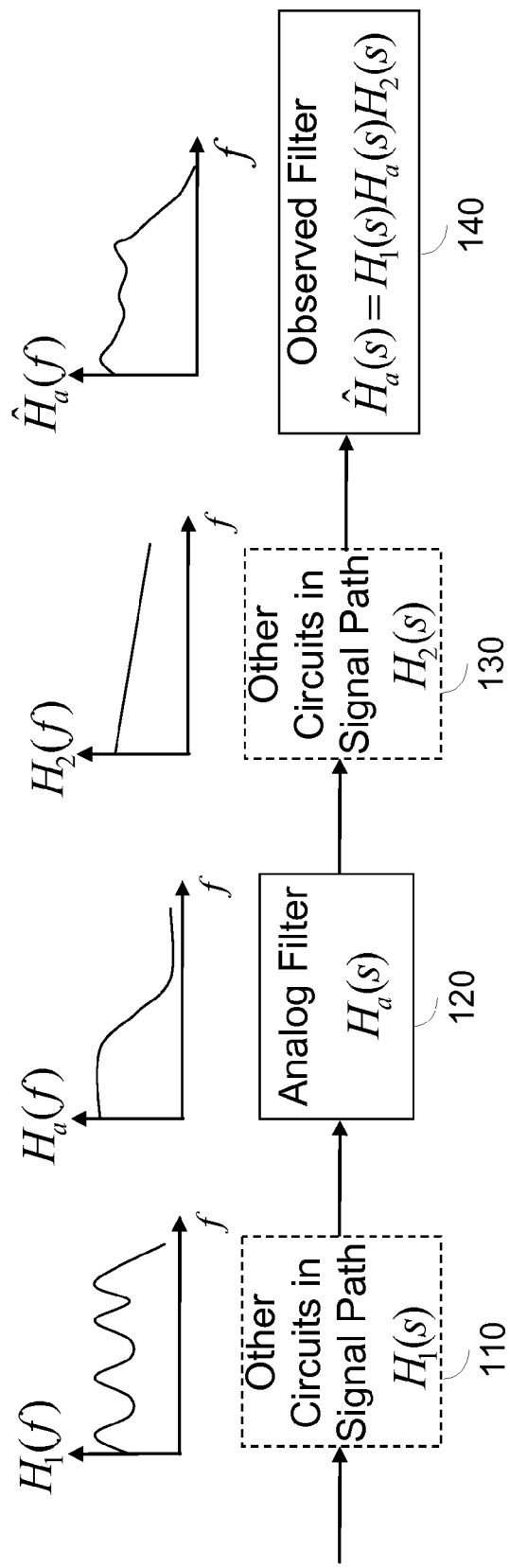
FIG. 1 illustrates how other circuits can induce observation errors.

Other circuits cause observation error of analog filter characteristics and affect filter tuning performance. For example, in a system on a chip (SoC), it can be impractical to isolate an analog filter 120 from its interconnected circuits. As shown in FIG. 1, circuits 110, 130 other than the analog filter 120 in the signal path for filter tuning leads to observation errors of the analog filter 120 being tuned. The transfer function $\hat{H}_a(s)$ of the observed filter 140 is expressed in Equation 1.

$$\hat{H}_a(s) = H_1(s) H_a(s) H_2(s) \qquad \text{Eq. 1}$$

The overall transfer function $\hat{H}_a(s)$ is a product of the actual transfer function $H_a(s)$ of the analog filter 120 being tuned, and transfer functions $H_1(s)$ and $H_2(s)$ of other circuits 110, 130 in the signal path. This illustrates the difficulties in observing the analog filter 120, which affects tuning of the analog filter 120. This problem becomes more serious for a multi-stage analog filter which can include, for example, several low-order filters scattered throughout a system. In such cases, a multi-stage analog filter is typically tuned stage-by-stage, which leaves the overall performance uncertain.

Techniques improve the performance of analog filters in, for example, system on a chip (SoC) applications and permit tuning of multi-stage high-order analog filters. In the illustrated embodiments, the analog filter 120 (FIG. 1) is tuned using a desired transfer function. However, in alternate embodiments, the analog filter 120 can be tuned to a desired impulse response.

Based on the transfer function desired for the analog filter 120 to be tuned, a time-invariant infinite impulse response (IIR) filter is derived that has a corresponding impulse response. The analog filter is then tuned such that its response to a periodic test signal matches relatively well, such as a best match, to that of the time-invariant IIR filter. The matching permits the analog filter 120 to meet multiple requirements such as passband flatness, cutoff frequency, stopband attenuation, group delay, etc. Since the analog filter 120 is uniquely defined by its transfer function or, alternatively, its impulse response, the analog filter 120 can be tuned to the intended design.

The disclosed tuning technique has the following advantages. The tuning technique is capable of tuning multiple filter parameters to meet more than one filter requirement at the same time. The tuning technique is capable of tuning an arbitrary-order analog filter. The tuning technique can compensate for observation errors induced by other circuits than the particular analog filter to be tuned and makes practical, the tuning of multiple-stage analog filters.

The filter tuning technique uses two signal paths for filter tuning. One is used to generate the reference filter response, and the other one is used to observe the analog filter's response during the tuning process. The two signal paths are designed such that they have common circuits except for the analog filter being tuned. In this way, circuits other than the analog filter being tuned have a common-mode effect on the reference response and the observed analog filter's response.

In one embodiment, the analog filter is tuned by minimizing the difference between the reference filter response and the observed analog filter's response. The filter tuning is not affected by the observed filter response error due to other circuits in the two signal paths. This unique architecture leads to superior performance. It can tune an analog filter accurately without requiring the isolation of the analog filter from the rest circuits during the tuning process. In addition, it simplifies system design by avoiding the need for an additional master analog filter as in the master-slave tuning methods. This attribute is particular useful for a system on a chip (SoC) application that can have a multiple-stage analog filter with, for example, several low-order filters scattered throughout the system. It enables tuning of the overall multiple-stage analog filter without the cumulative error of stage-by-stage tuning of the multiple-stage analog filter.

Figure 2:
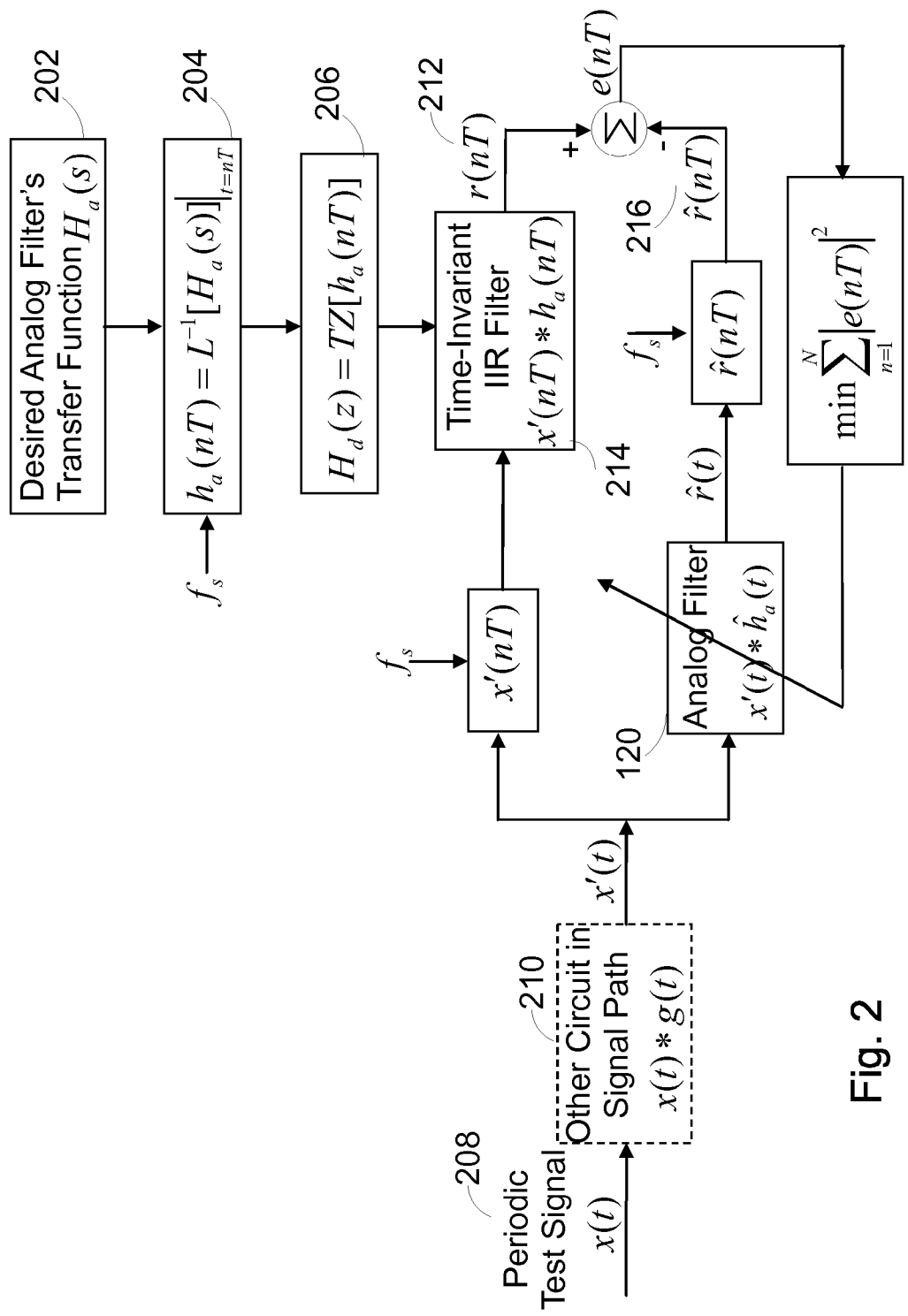
FIG. 2 illustrates a mathematical model of transfer-function based filter tuning.

FIG. 2 illustrates a mathematical model describing the analog filter tuning technique. A time-invariant IIR filter is first derived based on the desired transfer function $H_a$ 202 of the analog filter 120 (FIG. 1) to be tuned such that the derived IIR filter has the same impulse response as the analog filter's impulse response sampled at frequency $f_s$. The sampled impulse response $h_a(nT)$ 204 of the desired analog filter is expressed in Equation 2.

$$h_a(nT) = L^{-1}[H_a(s)]|_{t=nT} \qquad \text{Eq. 2}$$

In Equation 2, the period $$T = \frac{1}{f_s}$$

represents the ADC sampling interval. The time-invariant IIR filter transfer function $H_d(z)$ 206 is expressed in Equation 3.

$$H_d(z) = TZ[h_a(nT)] = TZ\{L^{-1}[H_a(s)]|_{t=nT}\} \qquad \text{Eq. 3}$$

Given a periodic test signal x(t) 208 and equivalent impulse response g(t) of other circuits 210 which may exist in the signal path for filter tuning, a reference filter response r(nT) 212 is expressed in Equation 4.

$$r(nT) = \{[x(t)*g(t)]_{t=nT}\}*h_a(nT) \qquad \text{Eq. 4}$$

The reference filter response r(nT) 212 is obtained by filtering the sampled test signal using the time-invariant IIR filter 214. If $\hat{h}_a(t)$ represents the actual impulse response of the analog filter 120 being tuned, the analog filter's response $\hat{r}(nT)$ 216 to the test signal sampled at frequency $f_s$ is expressed in Equation 5.

$$\hat{r}(nT) = [x(t)*g(t)*\hat{h}_a(t)]_{t=nT} \qquad \text{Eq. 5}$$

The analog filter 120 is tuned by adjusting its tunable parameters to minimize the difference between the reference response 212 and sampled analog filter's response 216. Examples of the tunable filter parameters $p = \{p_1, p_2, p_k\}$ are resistance, capacitance, transconductance, or other parameters depending on the particular configuration of analog filter 120. In one embodiment, a least squares algorithm as expressed in Equation 6 is used to minimize the matching error.

$$\min_{p \in R} \sum_{n=1}^{N} |r(nT) - \hat{r}(nT)|^2 \qquad \text{Eq. 6}$$

In Equation 6, N is the number of samples during one period of the test signal, and R is the solution space. Another algorithm that can be used is the recursive least square algorithm. Other applicable algorithms will be readily determined by one of ordinary skill in the art.

Figure 3:
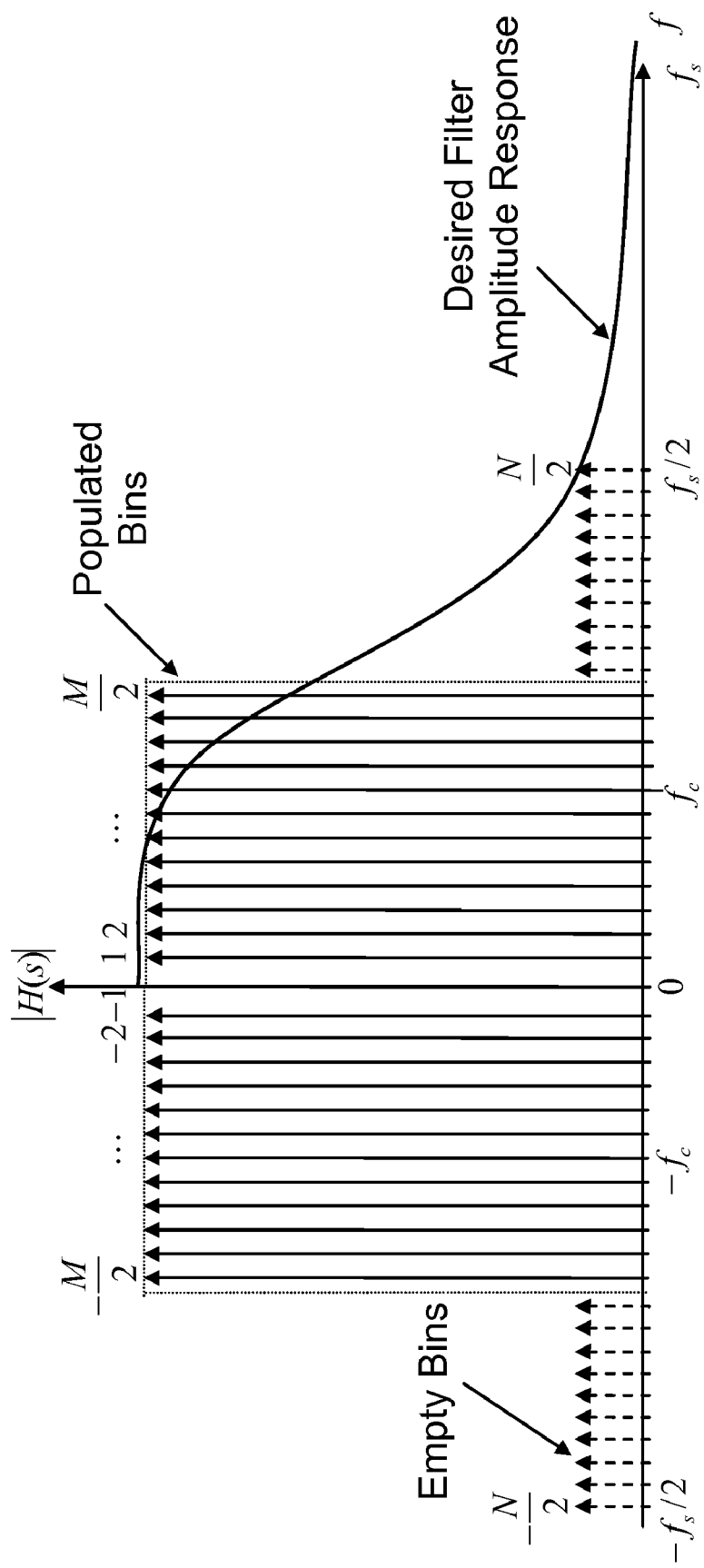
FIG. 3 illustrates a spectrum of a periodic orthogonal frequency division multiplexing (OFDM) test signal for analog filter tuning.

The periodic test signal x(t) 208 used for filter tuning can be any periodic signal depending on the specific application. In one embodiment, the periodic test signal x(t) 208 is initialized at a particular phase for each response capture so that responses from various configurations of the circuit are comparable. In one embodiment, the periodic test signal 208 corresponds to a periodic real orthogonal frequency-division multiplexing (OFDM) signal as shown in FIG. 3. An OFDM signal has a flat and conjugate symmetric spectrum across the populated sub-carriers. A number of sub-carriers are populated with equal power. Let $x_f(n)$ for $$n = -\frac{N}{2}, \ldots, -1, 1, \ldots, \frac{N}{2}$$

represents the nth bin of the sampled test signal in frequency domain and M represents the number of sub-carrier being populated, the periodic test signal 208 preferably satisfies the following constraints expressed in Equations 7 and 8:

$$\begin{cases} |x_f(n)| = c \\ x_f(n) = [x_f(-n)]^* \end{cases} \text{for } \frac{-M}{2} \leq n \leq \frac{M}{2} \qquad \text{Eq. 7}$$

$$x_f(n) = 0 \text{ for } \frac{-N}{2} \leq n < \frac{-M}{2} \text{ or } \frac{M}{2} < n \leq \frac{N}{2} \qquad \text{Eq. 8}$$

The bandwidth of the OFDM signal for the periodic test signal 208 is expressed in Equation 9.

$$B = \frac{M}{N} f_s \qquad \text{Eq. 9}$$

The bandwidth B can be 100% to 200% of the intended passband bandwidth of the analog filter depending on the effectiveness of the alias rejection and the sampling frequency. For communication devices with quadrature amplitude modulation, the use of a real OFDM test signal enables independent tuning of analog filters in in-phase and quadrature paths.

Figure 4:
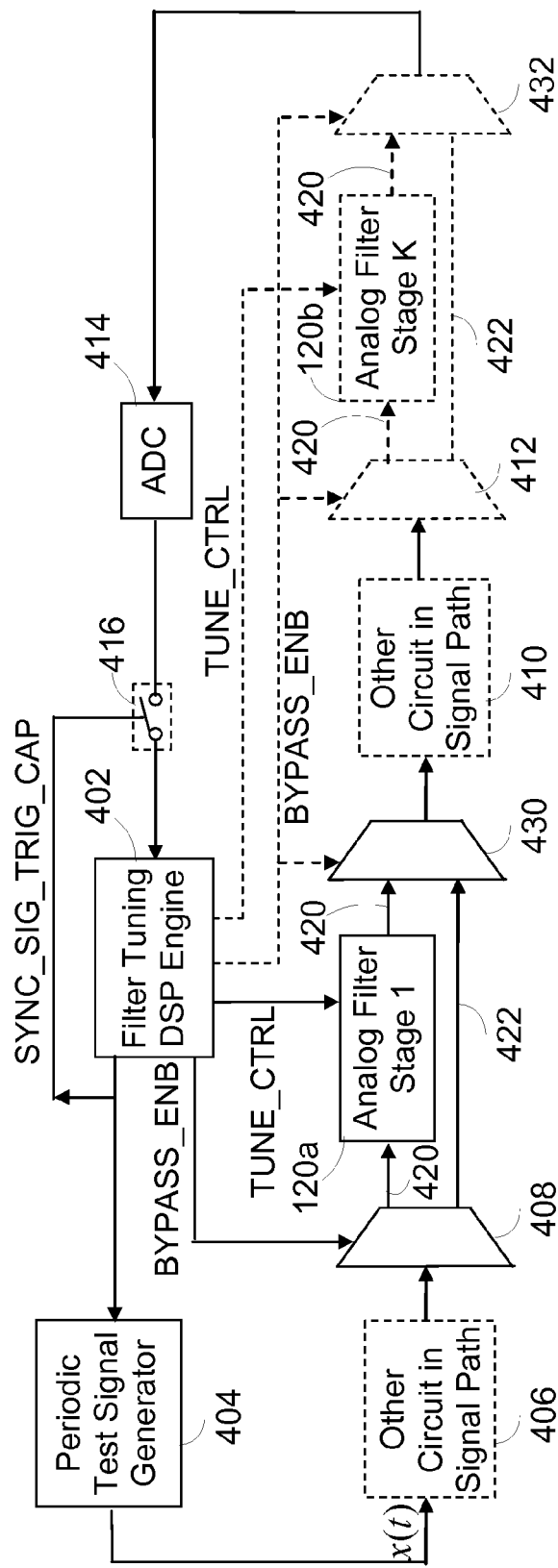
FIG. 4 illustrates an embodiment of an apparatus for analog filter tuning

FIG. 4 illustrates an embodiment of an apparatus for analog filter tuning. The analog filter tuning system includes a filter tuning DSP engine 402, a periodic test signal generator 404, a first "other" circuit in the signal path 406, a first demultiplexer 408, a first stage 120a of the analog filter 120, a first multiplexer 430, a second "other" circuit in the signal path 410, a second demultiplexer 412, a second stage 120b of the analog filter 120 (shown generically as stage K), a second multiplexer 432, an analog-to-digital converter (ADC) 414, and a trigger 416 for capturing at the DSP engine 402. The function provided by the demultiplexers 408, 412 and the multiplexers 430, 432 can also be implemented by controlled switches. One embodiment of the filter-tuning DSP engine 402 will be described in greater detail later in connection with FIG. 5.

The analog filter 120 to be tuned can comprise one or more stages. The precise number will vary depending on the design. Extra stages are optional. In the illustrated embodiment, two different stages 120a, 120b of the analog filter 120 are tuned. In FIG. 4, blocks 406, 410, 412, 422, 120b with dashed lines represent circuits for the example with the extra stage 120b of the analog filter 120a, 120b to be tuned.

The filter tuning system has two signal paths 420, 422. One signal path 420 is used to generate a reference filter response and the other signal path 422 is used to observe the analog filter's response during tuning process.

The two signal paths 420, 422 are preferably configured so that circuits other than the stages 120a, 120b of the analog filter 120 being tuned have a common-mode effect on the observed analog filter's response and the reference response. The switching between these two signal paths 420, 422 is controlled by control signal BYPASS_ENB, demultiplexers 408, 412, and multiplexers 430, 432. If the signal path 422 for the reference response generation is selected, the stages 120a, 120b of the analog filter 120 are bypassed. The input signal to the DSP engine 402 is fed into a time-invariant IIR filter and a reference filter response is formed. If the signal path 420 for analog filter observation is selected, the analog filter 120 operates in normal mode. At the DSP engine 402, the analog filter's response is captured and compared with the reference filter response until it is tuned to the desired state.

Figure 5:
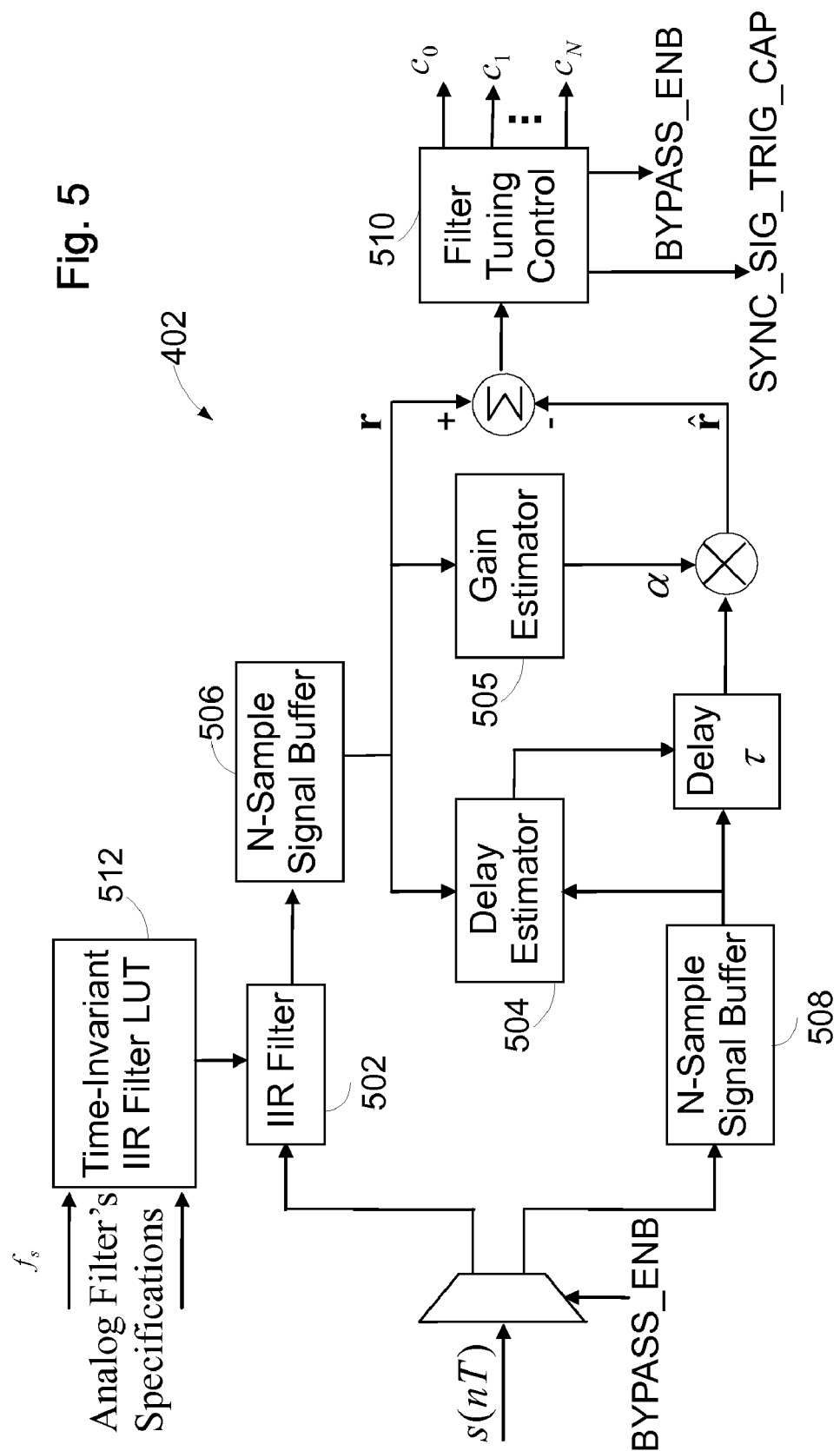
FIG. 5 is a schematic that illustrates a filter-tuning digital signal processing (DSP) for the embodiment illustrated in FIG. 4.

As illustrated in FIGS. 4 and 5, the two signal paths 420, 422 have common circuits except for the stages 120a, 120b of the analog filter 120 being tuned and its time-invariant counterpart. Circuits 406, 410 other than the analog filter 120 being tuned have a common-mode effect on the reference filter response and the observed analog filter's response. As a result, filter tuning results are immune to filter observation errors caused by filter-like circuits in the signal path and multiple stages 120a, 120b of the analog filter 120 can be tuned at the same time.

In the illustrated embodiment, the periodic test signal generator 404 and signal capturing at the DSP engine 402 are synchronously triggered by control signal SYNC_SIG_TRIG_CAP. Because of the synchronous triggering, the periodic test signal x(t) advantageously has the same initial phase for both the reference response generation and the observation of the analog filter's response, and, therefore fractional-sample delay estimation is not required in the calculation of the matching error.

FIG. 5 is a schematic that illustrates an embodiment of the DSP filter-tuning engine 402. The illustrated embodiment of the DSP filter tuning engine 402 includes a time-invariant IIR filter 502, a delay estimator 504, a gain estimator 505, buffers 506, 508, a filter control unit 510, and pre-computed look-up table (LUT) 512 for the time-invariant IIR filter's coefficients. The time-invariant IIR filter's coefficients are selected based on the desired transfer function of the analog filter 120 and the ADC sampling frequency. If the signal path 422 for the reference filter response is selected, the captured signal at the ADC 414 is provided as an input to the time-invariant IIR filter 502. N output samples of the time-invariant IIR filter 502 are buffered 506 and used as the reference filter response. If the signal path 420 for filter observation is selected, the signal captured at ADC 414 is aligned with the reference filter response in terms of gain and phase. The matching error is computed and the analog filter is tuned by minimizing the matching error between the reference filter response and the observed analog filter's response. The DSP filter tuning engine 402 may be embodied by a hardware specific circuit, by a software/firmware algorithm running on a processor, such as a microprocessor, microcontroller, general-purpose DSP, or the like, or by a combination of the same.

Figure 6:
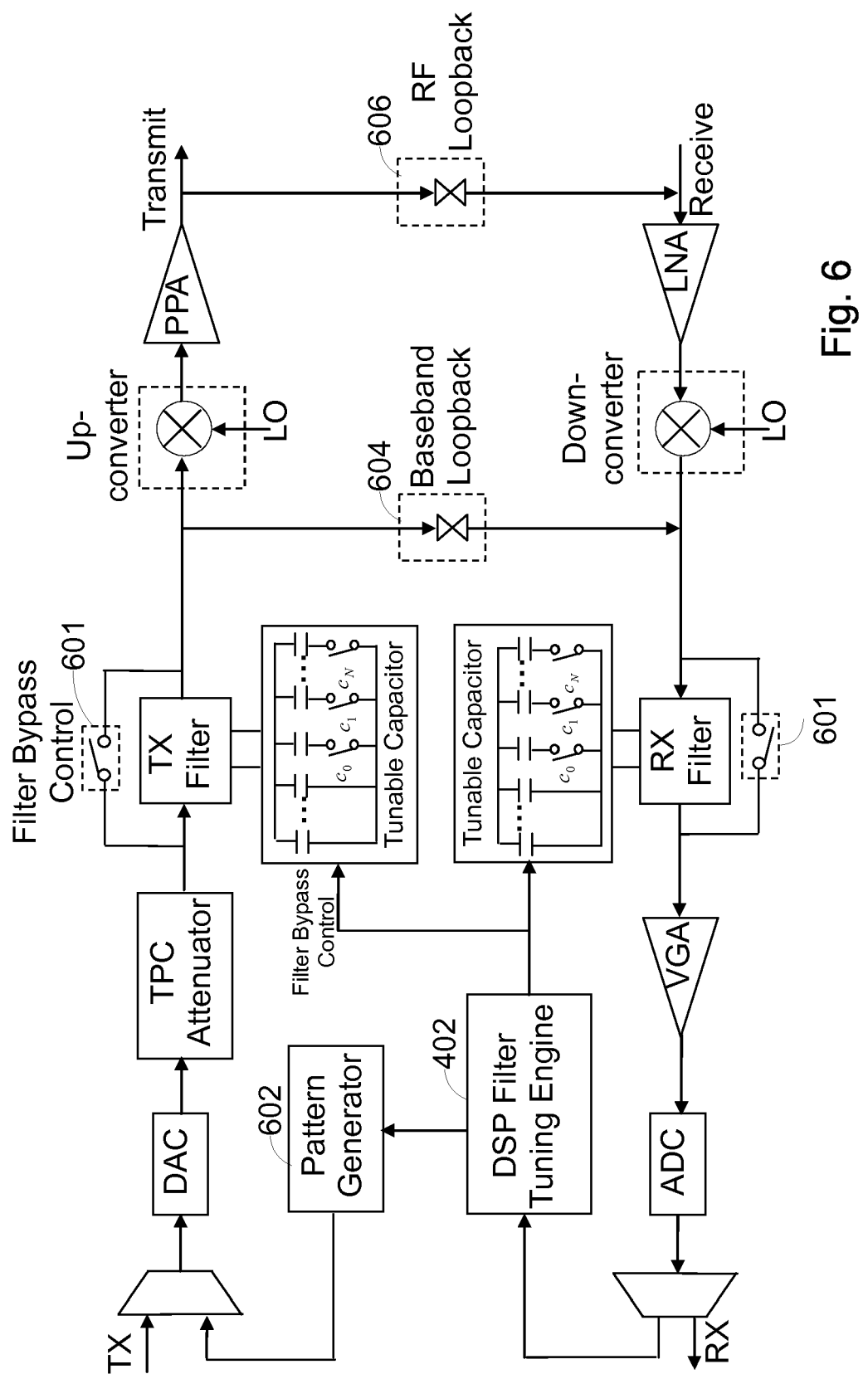
FIG. 6 is a schematic of a direct-conversion radio transceiver that incorporates the filter tuning system.

FIG. 6 is a schematic of a direct-conversion radio transceiver that incorporates the filter tuning system. The direct-conversion radio transceiver has been augmented with filter bypass control 601 and four additional blocks 602, 604, 606, 402 for filter tuning. A pattern generator 602 generates a periodic OFDM test signal dedicated to filter tuning. The baseband loopback block 604, or alternatively, the RF loopback block 606, connects TX with RX to form a signal path for the generation of reference filter response and the observation of the analog filter's response. The DSP filter tuning engine 402 processes the captured RX signal and finds a relatively good, such as, but not limited to, the optimum filter configuration.

Figure 7:
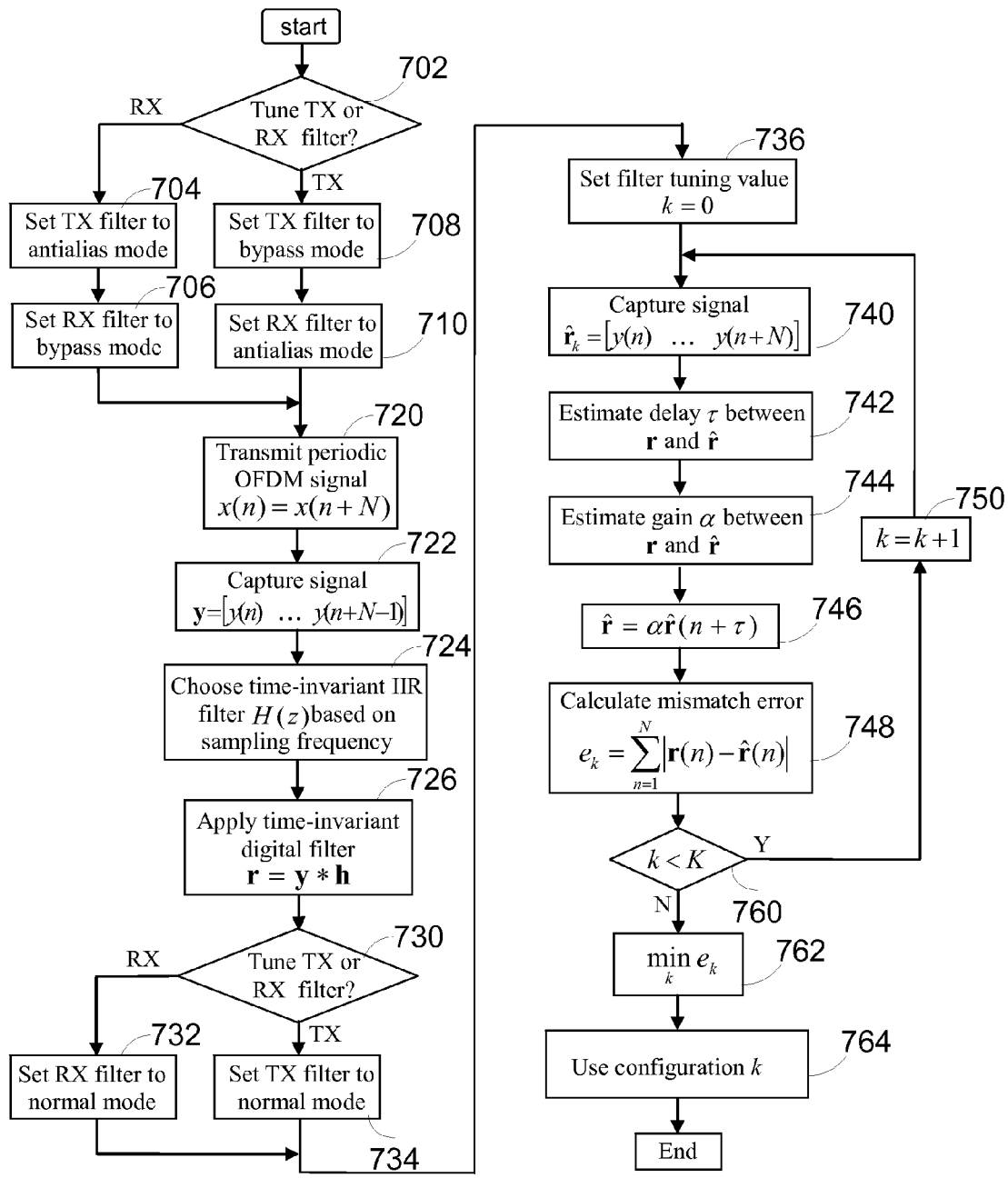
FIG. 7 illustrates a process for filter tuning illustrated in the context of a direct conversion radio transceiver.

An example of a filter tuning process for a direct-conversion radio transceiver is illustrated in FIG. 7. The process can be embodied in hardware, firmware, software, or any combination of the same. It will be appreciated by the skilled practitioner that the illustrated process can be modified in a variety of ways. For example, in another embodiment, various portions of the illustrated process can be combined, can be rearranged in an alternate sequence, can be removed, or the like.

In the decision block 702, the process determines whether to tune a transmitter filter or a receiver filter. States 704, 706, 708, 710 set the filters in appropriate modes. Bypass modes were described earlier in connection with FIG. 4. In an anti-alias mode, analog filters are set to active, and depending on a specific system, an appropriate passband bandwidth can be selected to prevent aliasing the test signal. In a state 720, an OFDM test signal is generated. In state 722, the propagated signal is captured at RX, with applicable analog filter stages to be tuned bypassed. In state 726, a time-invariant IIR filter is selected based on the configuration desired for the analog filter 120 to be tuned. The IIR filter is then applied to the signal captured in the state 722, resulting in the desired response r.

In the decision block 730, the process determines again a transmitter filter or a receiver filter is being tuned. Of course, the determination in the decision block 730 should be the same as the determination in the decision block 702.

A variety of techniques can be used to tune the one or more stages of the analog filter 120. For example, an adaptive method can be used. In the illustrated process for discrete tunable filters, a brute force technique is used, and the response $\hat{r}$ of a number K of analog filter configurations are assessed versus the desired response r. The number K is at least two. In one embodiment, the number K is a predetermined number. A variable k is used in the process as a loop counter, which is initialized to 0 in the state 736.

In states 740, 742, 744, 746, 748, the particular filter configuration is evaluated. In the illustrated embodiment, the mismatch error e is maintained for each value of k (each unique configuration assessed). In decision block 760, the process determines whether to repeat the process for a new configuration via state 750. Else, the process proceeds to the state 762, where the configuration with the least mismatch error e is found for across the values of k, and the corresponding configuration with the minimum mismatch is selected for use 764.

Various embodiments have been described above. Although described with reference to these specific embodiments, the descriptions are intended to be illustrative and are not intended to be limiting. Various modifications and applications may occur to those skilled in the art.

What is claimed is:

1. A method of tuning an analog filter of a circuit, the method comprising:

providing a configurable signal path, wherein at least a portion of the configurable signal path is selectable between at least a first signal path or a second signal path, wherein the second signal path includes one or more stages of the analog filter, wherein the first signal path bypasses the one or more stages of the analog filter;

providing a test signal generator having an output to an input of the configurable signal path;

providing an analog-to-digital converter having an input operatively coupled to an output of the configurable signal path;

providing a filter tuning engine having an input operatively coupled to an output of the analog-to-digital filter, wherein the filter tuning engine implements a time-invariant infinite impulse response (IIR) filter;

generating a test signal as an output of the test signal generator and providing the test signal to an input of the configurable signal path;

bypassing the one or more stages of the analog filter by selecting the first signal path for the configurable signal path;

determining a first response to a test signal of the first signal path to the test signal by capturing an output of the configurable signal path with the first signal path selected, wherein capturing is performed by the analog-to-digital converter and the filter tuning engine;

digitally filtering the first response with the time-invariant infinite impulse response (IIR) filter to generate a second response;

enabling the one or more stages of the analog filter by selecting the second signal path for the configurable signal path;

determining a third response of the second signal path to the test signal by capturing the output of the configurable signal path with the second signal path selected, wherein capturing is performed by the analog-to-digital converter and the filter tuning engine;

comparing the third response to the second response, wherein comparing is performed by the filter tuning engine; and selecting one or more filter parameters for adjustment of the one or more stages of the analog filter based at least partly on the comparison, wherein selecting is performed by the filter tuning engine.

2. The method of claim 1, further comprising:

repetitively configuring the one or more stages of the analog filter with one or more different filter parameters to obtain other third responses;

comparing the each of the third responses to the second response; and selecting a configuration for the one or more stages of the analog filter based at least partly on the comparisons to the second response.

3. The method of claim 1, wherein the test signal is periodic, further comprising synchronously initiating activation of or setting the test signal to a particular phase and initiating capture of a response from the first signal path or the second signal path so that the first response, the second response, and the third response are based on the same phase of the test signal.

4. The method of claim 1, wherein the test signal corresponds to a periodic test signal, further comprising:
repetitively configuring the one or more stages of the analog filter with one or more different filter parameters to obtain other third responses;
synchronously initiating activation of or setting the periodic test signal to a particular phase and initiating capture of each response from the first signal path or the second signal path;
comparing each of the third responses to the second response; and
selecting a configuration for the one or more stages of the analog filter based at least partly on the comparisons to the second response.

5. The method of claim 1, further comprising compensating for a difference in delay, gain, or both delay and gain between the third response and the second response prior to comparing the third response to the second response, wherein compensating is performed by the filter tuning engine.

6. The method of claim 1, further comprising comparing the third response to the second response using a least squares algorithm.

7. The method of claim 1, wherein the test signal comprises an orthogonal frequency division multiplexing (OFDM) signal having a flat frequency spectrum in an applicable range, wherein the applicable range comprises 100% to 200% of the intended passband bandwidth of the analog filter.

8. The method of claim 1, wherein the method is embodied in a direct-conversion RF transceiver, further comprising looping back the first response and the third response from a transmitter portion to a receiver portion in baseband.

9. The method of claim 1, wherein the method is embodied in a direct-conversion RF transceiver, further comprising looping back the first response and the third response from a transmitter portion to a receiver portion in radio frequency (RF).

10. An apparatus comprising:
one or more stages of an analog filter, wherein the analog filter is configured to be adjustable with respect to filtering characteristics;
a configurable signal path comprising a filtered path and a reference path, wherein the filtered path comprises the one or more stages of the analog filter, wherein the signal path is configurable to select between at least the reference path in which the one or more stages of the analog filter are bypassed, or the filtered path in which the one or more stages of the analog filter are not bypassed;
a test signal generator circuit having an output operatively coupled to an input of the configurable signal path, wherein the test signal generator circuit is configured to generate a test signal; and
a filter tuning engine operatively coupled to an output of the configurable signal path and to control inputs of the signal generator circuit, the configurable signal path, and the analog filter of the configurable signal path, wherein the filter tuning engine is configured to control adjustment of the analog filter and to control selection of the configurable signal path, the filter tuning engine further configured:
to determine a first response to the test signal of the reference path;
to digitally filter the first response with an time-invariant infinite impulse response (IIR) filter to generate a second response;
to determine a third response to the test signal of the filtered path; and
to select one or more filter parameters for the analog filter based at least partly on a comparison of the third response and the second response.

11. The apparatus of claim 10, wherein the one or more stages of the analog filter further comprise demultiplexers and multiplexers, wherein in a first state, the reference path that bypasses the one of more stages of the analog filter is selected via the demultiplexers and multiplexers, and in a second state, the filtered path that includes filtering of the one or more stages of the analog filter is selected via the demultiplexers and multiplexers.

12. The apparatus of claim 10, wherein the filter tuning engine is embodied by a processor that is configured to execute firmware or software instructions.

13. The apparatus of claim 10, wherein the filter tuning engine is configured:
to repetitively configure the one or more stages of the analog filter with one or more different filter parameters to obtain other third responses;
to compare the other third responses to the second response; and
to select a configuration for the one or more stages of the analog filter based at least partly on the comparisons to the second response.

14. The apparatus of claim 10, wherein the test signal is periodic, wherein the filter tuning engine is further configured to set or activate the test signal of the test signal generator circuit to a particular phase and to initiate capture of a response from the configurable signal path so that the first response, the second response, and the third response are based on the same phase of the test signal.

15. The apparatus of claim 10, wherein the test signal is periodic, wherein the filter tuning engine is configured:
to repetitively configure the one or more stages of the analog filter with one or more different filter parameters to obtain other third responses;
to set or activate the test signal of the test signal generator circuit to a particular phase for capture of each response from the configurable signal path so that the captured response is based on the same phase of the test signal to compare the other third responses to the second response; and
to select a configuration for the one or more stages of the analog filter based at least partly on the comparisons to the second response.

16. The apparatus of claim 10, wherein the filter tuning engine is configured to compensate for a difference in delay, gain, or both delay and gain between the third response and the second response prior to a comparison of the third response to the second response.

17. The apparatus of claim 10, wherein the filter tuning engine is configured to compare the third response to the second response in accordance with a least squares algorithm.

18. The apparatus of claim 10, wherein the test signal generator is configured to generate an orthogonal frequency division multiplexing (OFDM) signal having a flat frequency spectrum in an applicable range, wherein the applicable range comprises 100% to 200% of the intended passband bandwidth of the analog filter.

19. The apparatus of claim 10, wherein the apparatus comprises a direct-conversion RF transceiver, wherein the reference path and the filtered path are configured to loop back the first response and the third response from a transmitter portion to a receiver portion in baseband.

20. The apparatus of claim 10, wherein the apparatus comprises a direct-conversion RF transceiver, wherein the reference path and the filtered path are configured to loop back the first response and the third response from a transmitter portion to a receiver portion in radio frequency (RF).

21. The apparatus of claim 10, further comprising an analog-to-digital converter operatively coupled between an output of the configurable signal path and an input of the filter tuning engine.

22. An apparatus comprising:
   a filtered signal path comprising one or more stages of an analog filter;
   a configurable signal path comprising the filtered signal path and a reference signal path;
   means for bypassing or enabling the one or more stages of the analog filter via selection of the reference signal path or the filtered signal path, respectively;
   means for generating and providing a test signal as an input to the configurable signal path;
   means for determining a first response of the configurable signal path to the test signal with the reference signal path selected, the reference signal path having the one or more stages of the analog filter bypassed;
   means for digitally filtering the first response with a time-invariant infinite impulse response (IIR) filter to generate a second response;
   wherein the determining means also determines a third response of the configurable signal path to the test signal with the filtered signal path selected, the filtered signal path having the one or more stages of the analog filter active;
   means for comparing the third response to the second response; and
   means for selecting one or more filter parameters for adjustment of the one or more stages of the analog filter based at least partly on the comparison.

23. A computer readable medium which stores a computer program that embodies a method of tuning one or more stages of an analog filter of a circuit, wherein the circuit comprises a configurable signal path, wherein at least a portion of the configurable signal path is selectable between at least a first signal path or a second signal path, wherein the second signal path includes one or more stages of the analog filter, wherein the first signal path bypasses the one or more stages of the analog filter, wherein the circuit further comprises a test signal generator configured to generate a test signal as an output, wherein the test signal is provided as an input to the configurable signal path, wherein the circuit further comprises an analog-to-digital converter having an input operatively coupled to an output of the configurable signal path, wherein the circuit further comprises a digital signal processor (DSP) having an input operatively coupled to an output of the analog-to-digital filter, wherein the DSP is configured to execute the computer program, wherein the DSP implements a time-invariant infinite impulse response (IIR) filter, the method comprising:
   bypassing the one or more stages of the analog filter by selecting the first signal path for the configurable signal path;
   determining a first response of the first signal path to the test signal, by receiving a captured output of the configurable signal path with the first signal path selected, wherein the output is captured by the analog-to-digital converter and the DSP;
   digitally filtering the first response with the time-invariant infinite impulse response (IIR) filter to generate a second response;
   enabling the one or more stages of the analog filter by selecting the second signal path for the configurable signal path;
   determining a third response of the second signal path to the test signal by receiving a captured output of the configurable signal path with the second signal path selected, wherein the output is captured by the analog-to-digital converter and the DSP;
   comparing the third response to the second response, wherein comparing is performed by the DSP; and
   selecting one or more filter parameters for adjustment of the one or more stages of the analog filter based at least partly on the comparison, wherein selecting is performed by the DSP.

\* \* \* \* \*